(12) United States Patent
Ortet et al.

(10) Patent No.: US 8,148,644 B2
(45) Date of Patent: Apr. 3, 2012

(54) ELECTRONIC CARD AND AIRCRAFT INCLUDING SAME

(75) Inventors: Stephane Ortet, Mondonville (FR); Vincent Rebeyrotte, Colomiers (FR); David Rousset, Toulouse (FR)

(73) Assignee: Airbus Operations SAS, Toulouse (FR)

( * ) Notice: Subject to any disclaimer, the term of this patent is extended or adjusted under 35 U.S.C. 154(b) by 372 days.

(21) Appl. No.: 12/528,167

(22) PCT Filed: Feb. 18, 2008

(86) PCT No.: PCT/FR2008/000211
§ 371 (c)(1),
(2), (4) Date: Aug. 21, 2009

(87) PCT Pub. No.: WO2008/129155
PCT Pub. Date: Oct. 30, 2008

(65) Prior Publication Data
US 2010/0319965 A1 Dec. 23, 2010

(30) Foreign Application Priority Data
Feb. 22, 2007 (FR) ...................................... 07 53433

(51) Int. Cl.
*H05K 1/03* (2006.01)

(52) U.S. Cl. .......................... 174/255; 174/252; 174/260
(58) Field of Classification Search .......................... None
See application file for complete search history.

(56) References Cited

U.S. PATENT DOCUMENTS

| | | | |
|---|---|---|---|
| 3,244,795 A | 4/1966 | Latimer | |
| 4,526,835 A | 7/1985 | Takahashi et al. | |
| 4,916,260 A * | 4/1990 | Broaddus et al. | 174/268 |
| 7,002,081 B2 * | 2/2006 | Wang et al. | 174/260 |
| 7,323,641 B2 * | 1/2008 | Higuchi et al. | 174/250 |
| 2004/0218366 A1 | 11/2004 | Speigl | |

FOREIGN PATENT DOCUMENTS

FR 2 853 489 10/2004

* cited by examiner

*Primary Examiner* — Ishwarbhai Patel
(74) *Attorney, Agent, or Firm* — Oblon, Spivak, McClelland, Maier & Neustadt, L.L.P.

(57) ABSTRACT

An electronic card that includes at least two superimposed conducting layers with an insulation layer between the two conducting layers, the two conducting layers each including a utility conducting portion and a conducting portion at the periphery of the utility conducting portion with an insulating portion between the conducting portions, the insulating portion of a first of the two layers being offset relative to the insulating portion of the second of the layers. An aircraft includes a housing in which at least one such card is provided.

12 Claims, 2 Drawing Sheets

ELECTRONIC CARD AND AIRCRAFT INCLUDING SAME

BACKGROUND OF THE INVENTION

The present invention relates to an electronic card intended, for example, to be integrated into on-board equipment for aircraft.

There are already known electronic cards, such as represented schematically in FIG. 1, provided with at least two superposed conductive layers 2 separated from one another by electrically insulating layers 3.

Each conductive layer 2 has at least one peripheral conductive portion 6 and one useful central conductive portion 7 suitable for being connected electrically to electronic elements 4, 5 and separated from portion 6 by an insulating portion 8, whose dimensions and material are chosen to ensure sufficient electrical insulation between portions 6 and 7.

The material and the dimensions of layers 3 are also chosen to ensure sufficient electrical insulation between layers 2.

On these cards, insulating portions 8 are superposed on one another, with a portion 11 of an intermediate insulating layer 3 interposed between two adjacent portions 8.

SUMMARY OF THE INVENTION

The objective of the invention is to provide an electronic card of the same type that is just as reliable but that exhibits improved performances in terms of heat dissipation.

To this end it proposes an electronic card provided with at least two superposed conductive layers, having an electrically insulating layer between the said two conductive layers, the said two conductive layers each having a useful conductive portion and a conductive portion situated at the periphery of the said useful conductive portion with an electrically insulating portion between the said conductive portions, characterized in that the said insulating portion of a first of the said two layers is offset relative to the insulating portion of the second of the said two layers, in such a way that part of the useful conductive portion of the first of the said two layers is situated in vertical alignment with part of the insulating portion of the second of the said two layers, and in that part of the peripheral portion of the second of the said two layers is situated in vertical alignment with part of the insulating portion of the first of the said two layers.

The offset of the insulating portions from one layer to the other therefore makes it possible to "bring closer together" the useful conductive portion of one of the two layers (to which there are electrically connected electronic components that are heat sources when they are in operation) and the peripheral portion of the other layer. Since the insulating portions (poor heat conductors) are no longer superposed, the heat-barrier effect associated with stacking of these insulating portions over the same zone, as in the aforesaid prior art cards, is therefore considerably reduced, since the offset of these portions from one layer to the other makes it possible to reduce the distance separating two electrically conductive portions (also good heat conductors) situated on two different layers and opposite from one another relative to the insulating portions, in such a way that heat transfer by conduction therefore can take place between these portions from one layer to the other.

The heat to be dissipated, originating from the electronic components and conveyed by the useful conductive portions, can therefore be evacuated more effectively in the direction of the adjacent layers.

The card according to the invention therefore makes it possible to meet two needs, albeit antagonistic, namely to achieve good galvanic insulation while retaining sufficient heat dissipation power.

This arrangement therefore guarantees improved heat dissipation avoiding the risks of overheating, which contributes to increasing the reliability of operation of the electronic equipment, especially in the case where this is disposed in an impermeable compartment, in which case heat dissipation takes place substantially by conduction.

According to preferred characteristics, for reasons of simplicity and convenience both in manufacture and in use, the said insulating portions of the said two layers have the same dimensions.

According to other characteristics preferred for the same reasons as those explained hereinabove, the said offset is substantially equal to the distance separating the said conductive portions of the same layer.

In this way the card according to the invention is therefore optimized to facilitate heat dissipation by reducing the distance between two conductive portions of two adjacent layers opposite from one another relative to the insulating portions, while ensuring sufficient galvanic insulation, these layers being closer to one another but nevertheless without being superposed, in order to avoid any risk of capacitive coupling between conductive layers which could degrade the galvanic insulation.

According to still other preferred characteristics:
 the said card is provided with at least three conductive layers, whose insulating portions are offset alternatively in one direction then in the opposite direction from one layer to the other;
 the said insulating portions are made of epoxy;
 the said insulating layers are made of insulating material based on glass fibers;
 the width of an insulating portion is greater than the thickness of an insulating layer;
 the ratio between the width of an insulating portion and the thickness of an insulating layer is greater than five; and/or
 for each said layer, the said useful portion is adapted to be connected electrically to electronic components.

According to a second aspect, another objective of the invention is an aircraft equipped with a compartment in which there is disposed at least one card such as explained hereinabove.

According to other characteristics preferred for the same reasons as those explained hereinabove:
 the said compartment is an impermeable compartment; and/or
 at least one peripheral portion of each said electronic card disposed in the compartment is connected electrically to the frame of the aircraft.

BRIEF DESCRIPTION OF THE DRAWINGS

The explanation of the invention will now be continued by the detailed description of an exemplary embodiment, given hereinafter by way of illustration but in no way limitative, with reference to the attached drawings, wherein.

DETAILED DESCRIPTION OF THE INVENTION

Figure 2:
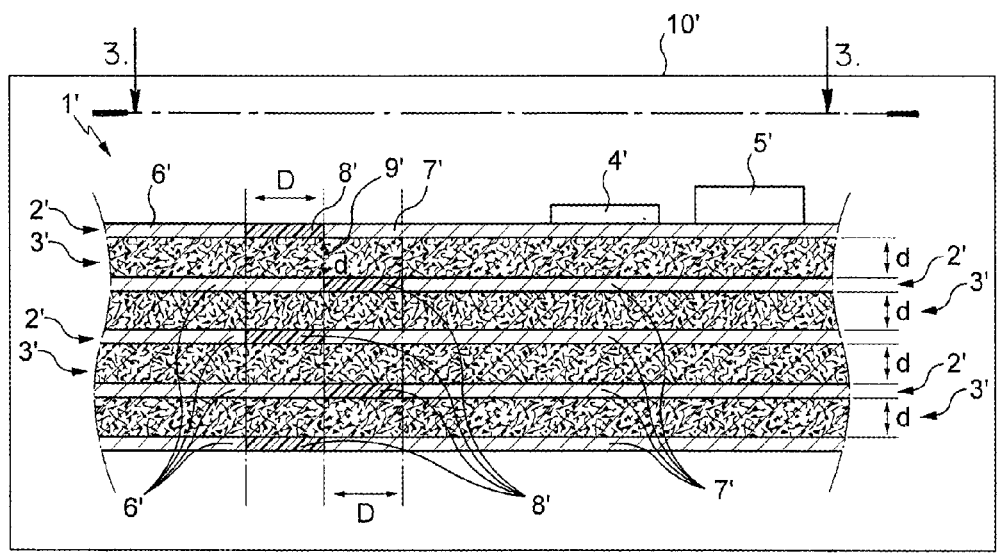
FIG. 2 is a schematic representation in section of an electronic card according to the invention.
Figure 3:
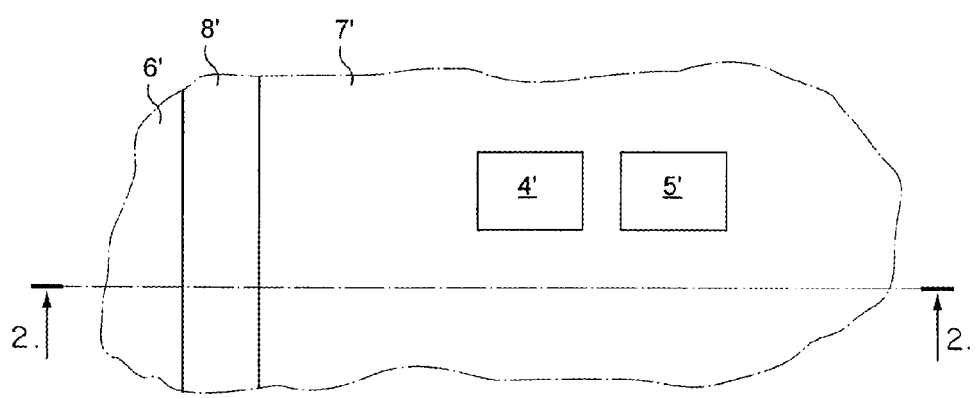
FIG. 3 is a top plan view of the electronic card of FIG. 2.

Electronic card 1' according to the invention and illustrated in FIG. 2 is provided with a card support (not represented) on which there is deposited a plurality of conductive layers 2' (of copper), between which there are interposed layers 3' of thickness d made of insulating material based on woven glass fibers (for example material known under the designation "FR4").

In the illustrated example, this card 1' is disposed together with other cards of the same type in an impermeable compartment 10', which is mounted in the electronic cabinet of an aircraft.

Each conductive layer 2' has a peripheral conductive portion 6' and a useful central conductive portion 7', portion 7' being separated from portion 6' by an insulating portion 8' made of epoxy.

On portion 7' of the upper conductive layer there are fixed electronic components 4' and 5', which are electrically connected to this portion or to lower portions 7' by means of vias (not represented).

Peripheral portion 6' is connected electrically to the frame of the equipment or of the aircraft, portion 7' in turn is insulated from the frame by virtue of portion 8', in such a way that this electronic card forms a floating equipment, the part supporting active elements 4' and 5' being insulated from the frame.

Insulating portions 8' have a width D designed to guarantee sufficient galvanic insulation between portions 6' and 7' of the same layer 2', especially in the case in which this device is conveyed to high altitudes, as is the case of on-board equipment in the aeronautics field.

In the illustrated example, and in order to ensure an insulation rating of 1600 V between portions 6' and 7' of the same layer 2', the width D is equal to 800 μm.

The distance d in turn is chosen to ensure sufficient insulation between two adjacent layers 2' while maintaining a minimum space requirement. This distance is shorter than the distance D, because the FR4 material used here has an insulating power greater than that of the epoxy. In the illustrated example, the distance d is equal to 80 μm and the ratio D/d is then equal to 10.

The plane-to-frame insulation rating achieved here is equal to 500 V.

This arrangement therefore makes it possible to achieve good galvanic insulation and also good performances from the viewpoint of electromagnetic compatibility.

In the electronic card according to the invention, insulating portions 8' are offset relative to one another by a distance equal to their width D in a direction that is alternating on shifting from one conductive layer to the other, in such a way that this card has a comb-like structure, as illustrated in FIG. 2.

Part of useful conductive portion 7' of upper layer 2' is therefore situated in vertical alignment with insulating portion 8' of the layer 2' directly below it, part of peripheral portion 6' of this layer itself being situated in vertical alignment with insulating portion 8' of the upper layer.

This offset from layer to layer therefore ensures that each insulating portion 8' is situated in vertical alignment with part of a conductive portion 6' or 7' of the layers 2' that are directly adjacent thereto, these parts of conductive portions themselves being situated in vertical alignment with insulating portion 8' of the opposite next adjacent layer 2' and so on.

Portion 6' of a layer 2' is therefore closer to portions 7' of adjacent layers 2', the minimum distance separating this portion 6' from portions 7' of the adjacent layers being equal to thickness d of layer 3', as represented by the double arrow denoted by reference 9' in FIG. 2.

The offset of portions 8' between layers is therefore equal to the distance separating portions 6' and 7' of the same layer, in such a way that two portions 6' and 7' are as close as possible to one another but without being superposed, in order to favor heat dissipation while avoiding the phenomena of capacitive coupling between portions 6' and 7' of different layers (harmful to galvanic insulation).

Since the distance d is very much smaller than the distance D, the heat conduction is greatly improved. In fact, from one layer to the other and in passing from a portion 7' of one layer to portion 6' of adjacent layers, the heat will be easily evacuated, since the minimal distance to be traveled through insulation (poor heat conductor) is reduced in this case to d (reference 9'), compared with a distance equal to D in the prior art (or in other words, the distance separating two portions 6, 7 of the same layer).

Thus, in the prior art card, the evacuation of heat takes place mainly in the plane of the layers (horizontally in FIG. 1) by virtue of the large thermal insulation due to the stacking of portions 8, whereas in the card according to the invention the offset of portions 8' permits evacuation of heat in a direction transverse to the plane of the layers (or in other words vertically in FIG. 2).

The evacuation of heat can therefore be achieved much more easily from one layer to the other, in order to maintain this card under acceptable temperature conditions to guarantee nominal operation of electronic components.

Figure 1:
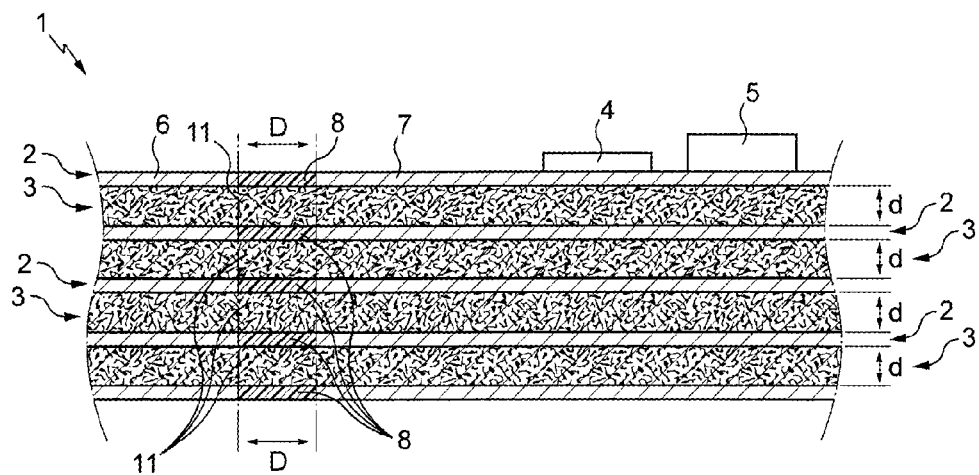
FIG. 1 is a schematic representation in section of a prior art electronic card.

Such cards are used in particular in emergency computers of aircraft, in which it has been possible to observe that for equal galvanic insulation, the thermal resistance of the surroundings of the card was two times smaller in the case of a comb-like architecture (FIG. 2) than in the case of an architecture insulated in traditional manner (FIG. 1).

It will be additionally noted that this comb-like arrangement does not lead to any extra manufacturing cost for the printed circuit board. Thus it remains particularly economical and practical to use.

In one variant not illustrated, the offset between two insulating portions 8' of two adjacent layers is smaller than the width D, in such a way that only part of the insulating portions is situated in vertical alignment with part of the corresponding conductive portions.

In yet another variant not illustrated, the offset of the insulating portions is implemented not in alternating direction from one layer to the other but always in the same direction, and/or the offset between two insulating portions of two adjacent layers is greater than the width D.

In yet another variant not illustrated, the insulating portions have variable dimensions from one layer to the other.

Numerous other variants are possible according to the circumstances, and it is recalled in this regard that the invention is not limited to the examples described and represented.

The invention claimed is:

1. An electronic card comprising:
   at least first and second superposed conductive layers with an electrically insulating layer between the first and second conductive layers, the first and second conductive layers each including a useful conductive portion and a conductive portion situated at the periphery of the useful conductive portion, and an electrically insulating portion between the conductive portions,
   wherein the insulating portion of the first conductive layer is offset relative to the insulating portion of the second conductive layer, such that part of the useful conductive portion of the first conductive layer is situated in vertical alignment with part of the insulating portion of the second conductive layer, and wherein part of the peripheral portion of the second conductive layer is situated in vertical alignment with part of the insulating portion of the first conductive layer.

2. A card according to claim 1, wherein the insulating portions of the first and second conductive layer have the same dimensions.

3. A card according to claim 1, wherein the offset is substantially equal to the distance separating the conductive portions of the same layer.

4. A card according to claim 1, comprising at least three conductive layers, whose insulating portions are offset alternatively in one direction then in the opposite direction from one layer to the other.

5. A card according to claim 1, wherein the insulating portions are made of epoxy.

6. A card according to claim 1, wherein the insulating layers are made of insulating material based on glass fibers.

7. A card according to claim 1, wherein the width of an insulating portion is greater than the thickness of an insulating layer.

8. A card according to claim 7, wherein the ratio between the width of an insulating portion and the thickness of an insulating layer is greater than five.

9. A card according to claim 1, wherein, for each conductive layer, the useful portion is adapted to be connected electrically to electronic components.

10. An aircraft comprising a compartment including at least one card according to claim 1.

11. An aircraft according to claim 10, wherein the compartment is an impermeable compartment.

12. An aircraft according to claim 10, wherein at least one peripheral portion of each electronic card in the compartment is connected electrically to the frame of the aircraft.

* * * * *